United States Patent
Asano et al.

(10) Patent No.: US 7,589,364 B2
(45) Date of Patent: Sep. 15, 2009

(54) ELECTRICALLY REWRITABLE NON-VOLATILE MEMORY ELEMENT AND METHOD OF MANUFACTURING THE SAME

(75) Inventors: Isamu Asano, Tokyo (JP); Natsuki Sato, Tokyo (JP); Tyler A. Lowrey, Rochester Hills, MI (US); Guy C. Wicker, Rochester Hills, MI (US); Wolodymyr Czubatyj, Rochester Hills, MI (US); Stephen J. Hudgens, Rochester Hills, MI (US)

(73) Assignee: Elpida Memory, Inc., Tokyo (JP)

( * ) Notice: Subject to any disclaimer, the term of this patent is extended or adjusted under 35 U.S.C. 154(b) by 7 days.

(21) Appl. No.: 11/264,129

(22) Filed: Nov. 2, 2005

(65) Prior Publication Data

US 2007/0096074 A1    May 3, 2007

(51) Int. Cl.
    *H01L 31/112*    (2006.01)
(52) U.S. Cl. .............................. 257/246; 257/E21.645
(58) Field of Classification Search ................. 257/246, 257/E21.645
    See application file for complete search history.

(56) References Cited

U.S. PATENT DOCUMENTS

| 5,536,947 | A | 7/1996 | Klersy et al. |
| 5,789,758 | A * | 8/1998 | Reinberg ........................ 257/3 |
| 2003/0151041 | A1* | 8/2003 | Chiang ........................... 257/3 |
| 2003/0209746 | A1 | 11/2003 | Horii |
| 2004/0183107 | A1* | 9/2004 | Horii et al. ................... 257/257 |
| 2005/0139816 | A1* | 6/2005 | Jeong et al. ..................... 257/2 |

OTHER PUBLICATIONS

Pirovano et al.; "Scaling Analysis of Phase-Change Memory Technology"; IEEE; c. 2003.
Hwang et al.; "Writing Current Reduction for High-Density Phase Change-RAM"; IEEE; c. 2003.
Ha et al.; "An Edge Contact Cell for Phase Change RAM Featuring Very Low Power Consumption"; *Symposium of VLSI Technology Digest of Technical Papers*; c. 2003.
Chinese Office Action, with English translation, issued in Chinese Patent Application No. CN 200610143924.2, mailed Aug. 22, 2008.

* cited by examiner

*Primary Examiner*—Bradley K Smith
*Assistant Examiner*—Amar Movva
(74) *Attorney, Agent, or Firm*—McDermott Will & Emery LLP

(57) ABSTRACT

A non-volatile memory element includes a first interlayer insulation layer 11 having a first through-hole 11a, a second interlayer insulation layer 12 having a second through-hole 12a formed on the first interlayer insulation layer 11, a bottom electrode 13 provided in the first through-hole 11, recording layer 15 containing phase change material provided in the second through-hole 12, a top electrode 16 provided on the second interlayer insulation layer 12, and a thin-film insulation layer 14 formed between the bottom electrode 13 and the recording layer 15. In accordance with this invention, the diameter D1 of a bottom electrode 13 buried in a first through-hole 11a is smaller than the diameter D2 of a second through-hole 12a, thereby decreasing the thermal capacity of the bottom electrode 13. Therefore, when a pore 14a is formed by dielectric breakdown in a thin-film insulation layer 14 and the vicinity is used as a heating region, the amount of heat escaping to the bottom electrode 13 is decreased, resulting in higher heating efficiency.

3 Claims, 13 Drawing Sheets

ELECTRICALLY REWRITABLE NON-VOLATILE MEMORY ELEMENT AND METHOD OF MANUFACTURING THE SAME

TECHNICAL FIELD

The present invention relates to an electrically rewritable non-volatile memory element and to a method of manufacturing the element. More specifically, the present invention relates to an electrically rewritable non-volatile memory element having a recording layer that includes phase change material, and to a method of manufacturing the element.

BACKGROUND OF THE INVENTION

Personal computers and servers and the like use a hierarchy of memory devices. There is lower-tier memory, which is inexpensive and provides high storage capacity, while memory higher up the hierarchy provides high-speed operation. The bottom tier generally consists of magnetic storage such as hard disks and magnetic tape. In addition to being non-volatile, magnetic storage is an inexpensive way of storing much larger quantities of information than solid-state devices such as semiconductor memory. However, semiconductor memory is much faster and can access stored data randomly, in contrast to the sequential access operation of magnetic storage devices. For these reasons, magnetic storage is generally used to store programs and archival information and the like, and, when required, this information is transferred to main system memory devices higher up in the hierarchy.

Main memory generally uses dynamic random access memory (DRAM) devices, which operate at much higher speeds than magnetic storage and, on a per-bit basis, are cheaper than faster semiconductor memory devices such as static random access memory (SRAM) devices.

Occupying the very top tier of the memory hierarchy is the internal cache memory of the system microprocessor unit (MPU). The internal cache is extremely high-speed memory connected to the MPU core via internal bus lines. The cache memory has a very small capacity. In some cases, secondary and even tertiary cache memory devices are used between the internal cache and main memory.

DRAM is used for main memory because it offers a good balance between speed and bit cost. Moreover, there are now some semiconductor memory devices that have a large capacity. In recent years, memory chips have been developed with capacities that exceed one gigabyte. DRAM is volatile memory that loses stored data if its power supply is turned off. That makes DRAM unsuitable for the storage of programs and archival information. Also, even when the power supply is turned on, the device has to periodically perform refresh operations in order to retain stored data, so there are limits as to how much device electrical power consumption can be reduced, while yet a further problem is the complexity of the controls run under the controller.

Semiconductor flash memory is high capacity and non-volatile, but requires high current for writing and erasing data, and write and erase times are slow. These drawbacks make flash memory an unsuitable candidate for replacing DRAM in main memory applications. There are other non-volatile memory devices, such as magnetoresistive random access memory (MRAM) and ferroelectric random access memory (FRAM), but they cannot easily achieve the kind of storage capacities that are possible with DRAM.

Another type of semiconductor memory that is being looked to as a possible substitute for DRAM is phase change random access memory (PRAM), which uses phase change material to store data. In a PRAM device, the storage of data is based on the phase state of phase change material contained in the recording layer. Specifically, there is a big difference between the electrical resistivity of the material in the crystalline state and the electrical resistivity in the amorphous state, and that difference can be utilized to store data.

This phase change is effected by the phase change material being heated when a write current is applied. Data is read by applying a read current to the material and measuring the resistance. The read current is set at a level that is low enough not to cause a phase change. Thus, the phase does not change unless it is heated to a high temperature, so data is retained even when the power supply is switched off.

An effective way of using the write current to efficiently heat the phase change material is to concentrate the conduction path of the current by shrinking the size of the region that is heated. In "Scaling Analysis of Phase-Change Memory Technology," A. Pirovano, A. L. Lacaita, A. Benvenuti, F. Pellizzer, S. Hudgens, and R. Bez, IEEE 2003 and "Writing Current Reduction for High-density Phase-change RAM," Y. N. Hwang, S. H. Lee, S. J. Ahn, S. Y. Lee, K. C. Ryoo, H. S. Hong, H. C. Koo, F. Yeung, J. H. Oh, H. J. Kim, W. C. Jeong, J. H. Park, H. Horii, Y. H. Ha, J. H. Yi, G. H. Hoh, G. T. Jeong, H. S. Jeong, and Kinam Kim, "IEEE 2003, this is done by reducing the diameter of the bottom electrode constituting the heater. In the case of "An Edge Contact Type Cell for Phase Change RAM Featuring Very Low Power Consumption," Y. H. Ha, J. H. Yi, H. Horii, J. H. Park, S. H. Joo, S. 0. Park, U-In Chung, and J. T. Moon, 2003 Symposium on VLSI Technology Digest of Technical Papers, the heated region is limited by effecting edge contact between the recording layer in the phase change material and the lower heater electrode.

However, the methods described in the references are all constrained by lithography resolution limits, which make it difficult to achieve an adequate reduction in the size of the heating region. In contrast, U.S. Pat. No. 5,536,947 describes a method in which a pore is formed by dielectric breakdown in a thin-film insulation layer between the recording layer and the heater electrode. The diameter of the pore thus formed is far smaller than the diameter of any through-hole or the like that can be formed using lithography.

In the case of the device described in U.S. Pat. No. 5,536,947, the heated region could therefore be made extremely small by concentrating the current conduction path in the pore, increasing the heating efficiency of the write current. This made it possible to use a smaller write current and also speeded up write operations.

However, because the bottom electrode to which the pore is set in opposition has a relatively large area, the heat generated by the write current tends to flow away to the bottom electrode, reducing the heating efficiency.

SUMMARY OF THE INVENTION

It is therefore an object of the present invention to provide an improved electrically rewritable non-volatile memory element with a recording layer that contains phase change material and a method of manufacturing the element.

Another object of the present invention is to provide an electrically rewritable non-volatile memory element with a recording layer that contains phase change material having improved heating efficiency, and a method of manufacturing the element.

The above and other objects of the present invention can be accomplished by a non-volatile memory element comprising a first interlayer insulation layer having a first through-hole, a second interlayer insulation layer having a second through-hole formed on the first interlayer insulation layer with at least a part of the second through-hole overlapping at least a part of the first through-hole, a bottom electrode provided in the first through-hole, at least one recording layer containing phase change material, at least a part of the recording layer being provided in the second through-hole, a top electrode provided on the second interlayer insulation layer, and a thin-film insulation layer formed between the bottom electrode and the recording layer, wherein the bottom electrode has a diameter that is smaller than the diameter of the second through-hole.

In accordance with this invention, the diameter of a bottom electrode embedded in a first through-hole is smaller than the diameter of a second through-hole in which a recording layer is provided, thereby decreasing the thermal capacity of the bottom electrode. Therefore, when a pore is formed by dielectric breakdown in a thin-film insulation layer and the vicinity is used as a heating region, the amount of heat escaping to the bottom electrode is decreased, resulting in higher heating efficiency than in the prior art.

In this invention, it is desirable for at least one recording layer to include first and second recording layers, and for a thin-film insulation layer to be provided between the first and second recording layers. Generally, recording layers that contain phase change material have low thermal conductivity, so heating efficiency can be increased by disposing the thin-film insulation layer between two recording layers.

In such a case, it is more preferable for the thin-film insulation layer to be provided in contact with the upper surface of the second recording layer. This structure can be achieved by etching back after forming the first recording layer, making it possible to set a desired distance between the bottom electrode and the thin-film insulation layer. Thus, heat conduction to the bottom electrode can be further reduced by increasing the distance from the bottom electrode to the thin-film insulation layer.

In a preferred embodiment of the present invention, a cavity is provided in the upper surface of the first recording layer, and the cavity is filled with the second recording layer via the thin-film insulation layer. The ability to thereby control the location of the pore, with respect to the floor of the cavity, can be used to increase device reliability.

In another preferred embodiment of the invention, the inside wall of the second through-hole is covered by a sidewall insulation film, so the diameter of the through-hole formed in the recording layer can be less than the lithography resolution. This increases heating efficiency by decreasing the volume of the recording layer.

It is preferable that the distance from the part of the. thin-film insulation layer closest to the bottom electrode to the top electrode be greater than the shortest distance between the thin-film insulation layer and the bottom electrode. In the non-volatile memory device of this invention, the bottom electrode has a small thermal capacity, so heating efficiency is further increased by having a large distance between the thin-film insulation layer and the top electrode.

The above and other objects of the present invention can also be accomplished by a non-volatile memory element comprising a top electrode, a bottom electrode having a smaller thermal capacity than the top electrode, an interlayer insulation layer having a through-hole provided between the bottom electrode and the top electrode, first and second recording layers that contain phase change material and at least part of which are provided in the through-hole, and a thin-film insulation layer provided between the first recording layer and the second recording layer, wherein a distance from a part of the thin-film insulation layer that is closest to the bottom electrode to the top electrode is greater than the shortest distance from the thin-film insulation layer to the bottom electrode.

According to this aspect of the present invention, heating efficiency is also increased by having the thin-film insulation layer sandwiched between recording layers having low thermal conductivity, and by locating the thin-film insulation layer close to the bottom electrode which has a relatively small thermal capacity.

A method for manufacturing a non-volatile memory element according to the present invention comprising a first step for forming a first interlayer insulation layer, a second step for forming a first through-hole in the first interlayer insulation layer, a third step for forming a bottom electrode in the first through-hole, a fourth step for forming a second interlayer insulation layer on the first interlayer insulation layer, a fifth step for forming a second through-hole in the second interlayer insulation layer to expose at least a part of the bottom electrode, a sixth step for forming a thin-film insulation layer and at least one recording layer containing phase change material on the second interlayer insulation layer so that at least part of the recording layer is formed in the second through-hole, and a seventh step for forming a top electrode on at least one recording layer.

In accordance with this invention, the amount of heat escaping towards the bottom electrode can be reduced by making the diameter of the bottom electrode buried in the first through-hole smaller than the diameter of the second through-hole.

It is preferable that at least one recording layer includes first and second recording layers, and the sixth step preferably comprises a first sub-step of forming the first recording layer, a second sub-step of forming a thin-film insulation layer on the first recording layer, and a third sub-step of forming the second recording layer on the thin-film insulation layer. According to this arrangement, a heating efficiency further increases.

After the first sub-step but before the second sub-step, preferably there is a fourth sub-step in which the first recording layer is etched back. This can be used to set a distance between the bottom electrode and the thin-film insulation layer that further decreases the thermal conductivity towards the bottom electrode.

In accordance with a preferred embodiment of the present invention, a sidewall insulation film is formed on the inside wall of the second through-hole, after the fifth step but before the sixth step. This allows the diameter of the through-hole formed in the recording layer to be less than the lithography resolution, and thus increases heating efficiency by decreasing the volume of the recording layer.

As described above, an electrically rewritable non-volatile memory element having improved heating efficiency, and a method of manufacturing the element can be provided. Therefore, not only a write current can be decreased but also a writing speed can be enhanced.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
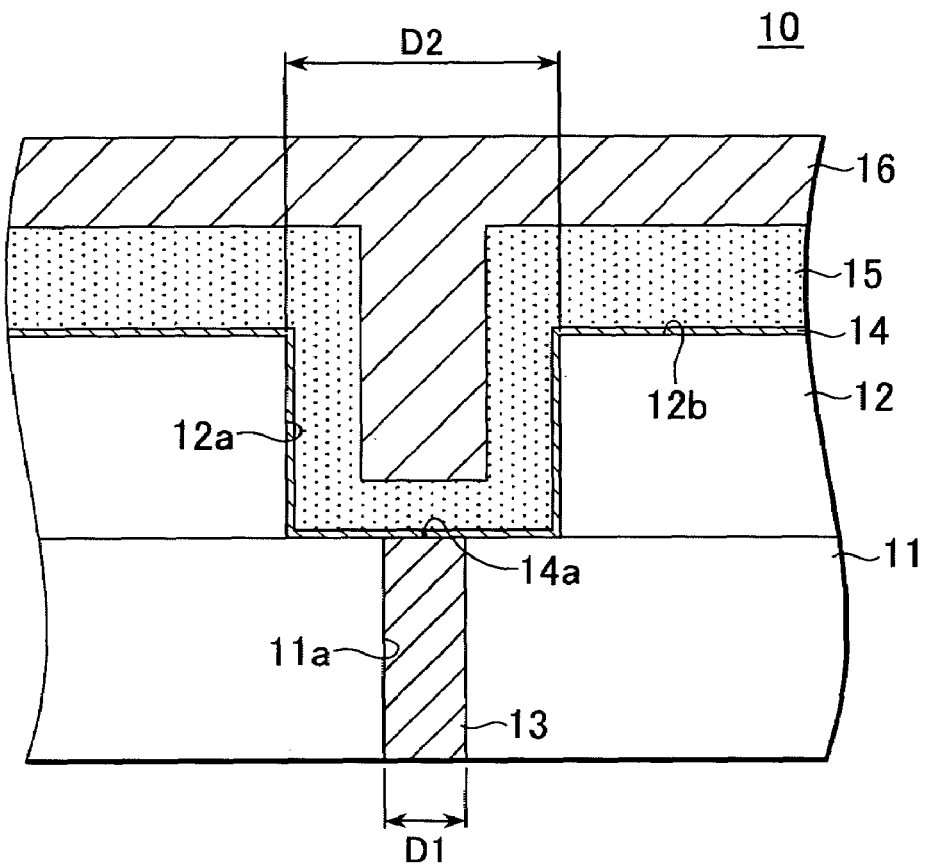
FIG. 1 is a cross-sectional view of the memory element according to a first embodiment of the present invention.

FIG. 1 shows a non-volatile memory element 10 according to a first embodiment of the present invention, including a first interlayer insulation layer 11 with a first through-hole 11a, a second interlayer insulation layer 12 with a second through-hole 12a, a bottom electrode 13 set within the first through-hole 11a, and a thin-film insulation layer 14, recording layer 15 and top electrode 16 formed, in that order, on the second interlayer insulation layer 12.

The interlayer insulation layers 11 and 12 can be formed of silicon oxide. The diameter D1 of the first through-hole 11a is smaller than that of the second through-hole 12a. In this embodiment, the diameter D1 of the first through-hole 11a is the same as the diameter of the bottom electrode 13. Also, there is an overlap between at least part of the upper opening of the first through-hole 11a and at least part of the lower opening of the second through-hole 12a. In this embodiment, as shown in FIG. 1, all of the upper opening of the first through-hole 11a is overlapped by part of the lower opening of the second through-hole 12a.

The bottom electrode 13 is used as a heater plug, constituting part of the heater during data writes. For this, the bottom electrode 13 is preferably formed of a material having a relatively high electrical resistance, such as metal silicides, metal nitrides and nitrides of metal silicides. These include, but are not limited to, TiAlN, TiSiN, TiCN and other such materials. Although the thermal conductivity of these materials is relatively low, it is higher than that of an insulation layer, so the bottom electrode 13 forms a pathway for the dissipation of heat from the recording layer 15.

The pore 14a is formed in the thin-film insulation layer 14 by dielectric breakdown. In this embodiment, the thin-film insulation layer 14 covers the upper surface 12b and second through-hole 12a of the second interlayer insulation layer 12. The material of the thin-film insulation layer 14 may be chosen from, but is not limited to, insulating materials such as $Si_3N_4$, $SiO_2$ and $Al_2O_3$. The thin-film insulation layer 14 has to be thin enough for an applicable voltage to give rise to dielectric breakdown.

The pore 14a is formed by applying a high voltage across the electrodes 13 and 16 to produce a dielectric breakdown in the thin-film insulation layer 14. The diameter of the pore 14a thus formed is much smaller than the diameter of a through-hole or the like formed by lithography, so the conduction path of a current passing through the memory element 10 is concentrated in the pore 14a.

The recording layer 15 is formed of phase change material. While the phase change material is not particularly limited and may be any material that takes two or more states and in which each state has a different electrical resistance, it is preferable to choose a chalcogenide material. Chalcogenide material means an alloy containing one or more elements such as germanium, antimony, tellurium, indium, and selenium. Examples include binary system alloys such as GaSb, InSb, InSe, $Sb_2Te_3$, and GeTe; ternary system alloys such as $Ge_2Sb_2Te_5$, InSbTe, GaSeTe, $SnSb_2Te_4$, and InSbGe; and quaternary system alloys such as AgInSbTe, (GeSn)SbTe, GeSb (SeTe), and $Te_{81}Ge_{15}Sb_2S_2$.

The phase change material containing the chalcogenide material can take an amorphous state or a crystalline state. In the amorphous state the resistance is relatively high, and in the crystalline state the resistance is relatively low.

Figure 2:
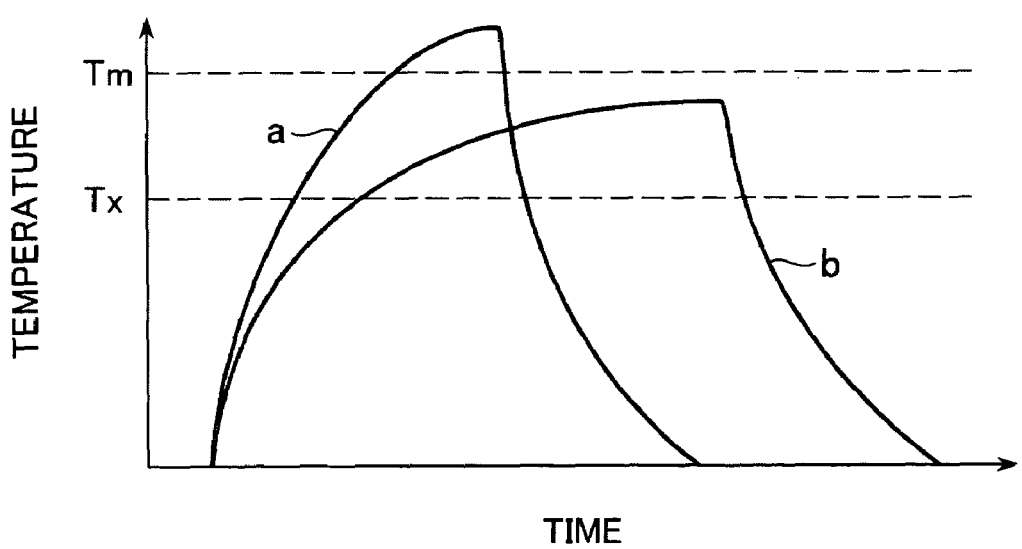
FIG. 2 is a graph for explaining the method of controlling the phase state of phase change material containing chalcogenide material.

FIG. 2 is a graph for explaining the method of controlling the phase state of phase change material containing chalcogenide material.

The phase change material is changed to the amorphous state by heating it to or above the melting temperature Tm and then cooling it, as shown by the curve a in FIG. 2. To change the material to the crystalline state, it is heated to a temperature that is at least as high as the crystallization temperature Tx and below the melting temperature Tm, as shown by curve b in FIG. 2. The heating temperature is controlled by controlling the duration and the amount of current per unit time that is passed through the material during the heating.

While there is no particular limitation on the thickness of the recording layer 15, in this embodiment it set at a thickness that does not completely bury the second through-hole 12a. However, it may be made thick enough to bury the second through-hole 12a. The bottom electrode 13 is set in opposition to the top electrode 16. The top electrode 16 is preferably made of a material having a relatively low thermal conductivity so that heat generated by the heating current cannot easily diffuse. Specific examples are TiAlN, TiSiN, TiCN, as in the case of the bottom electrode 13.

The non-volatile memory element 10 thus constituted can be formed on a semiconductor substrate in the form of a matrix to constitute an electrically rewritable non-volatile memory device.

Figure 3:
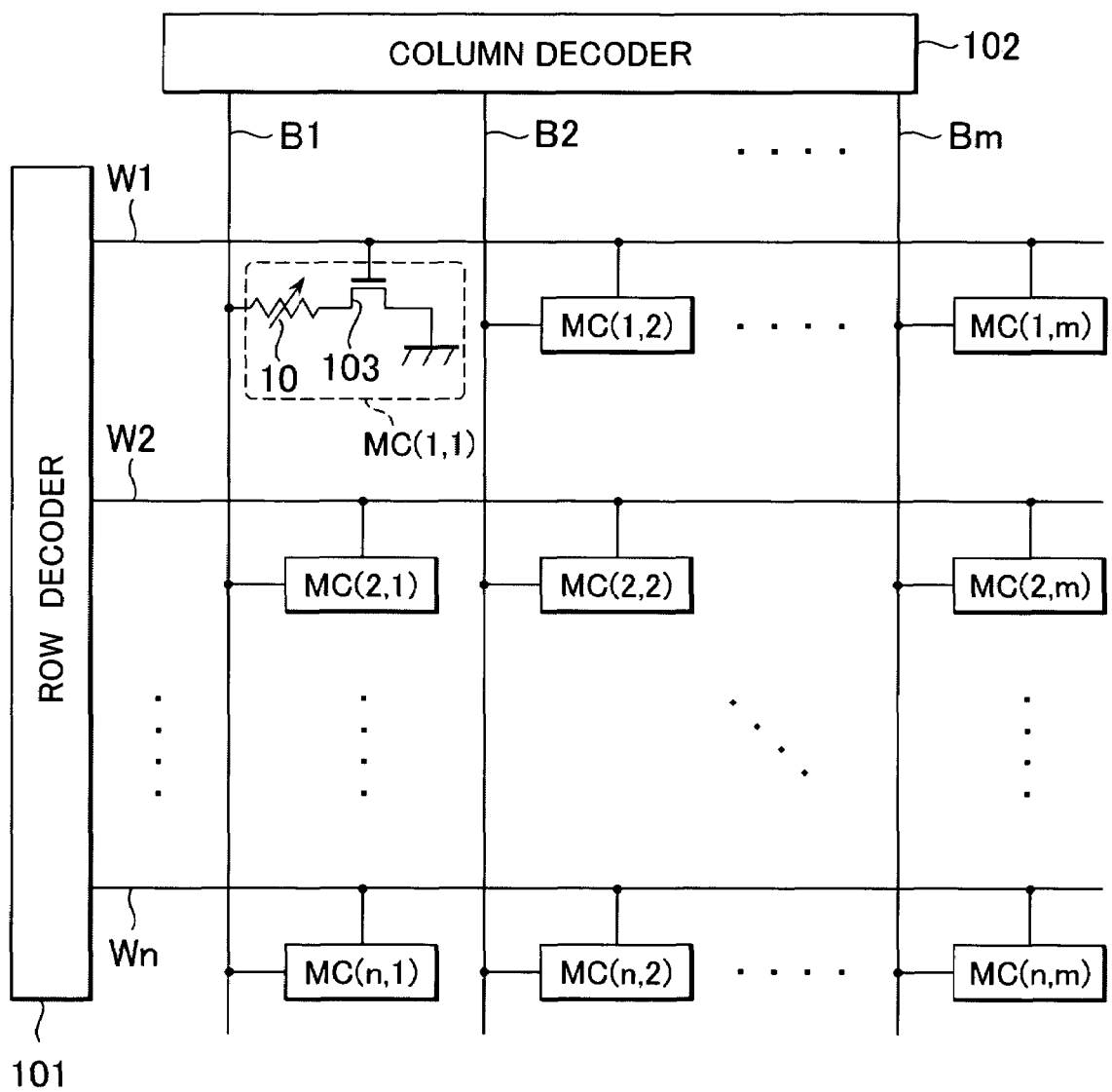
FIG. 3 is a circuit diagram of a non-volatile memory device configured as a matrix of n rows and m columns.

FIG. 3 is a circuit diagram of a non-volatile memory device configured as a matrix of n rows and m columns.

The non-volatile memory device shown in FIG. 3 has n word lines W1 to Wn, m bit lines B1 to Bm, and memory cells MC (1, 1) to MC (n, m), each located at an intersection of a word line and bit line. The word lines W1 to Wn are connected to a row decoder 101 and the bit lines B1 to Bm are connected to a column decoder 102. Each memory cell MC consists of a memory element 10 and transistor 103 connected in series between the corresponding bit line and ground. The control terminal of transistor 103 is connected to the corresponding word line. Thus, one of either the bottom electrode 13 and top electrode 16 is connected to the corresponding bit line, and the other is connected to the corresponding transistor 103.

Figure 4:
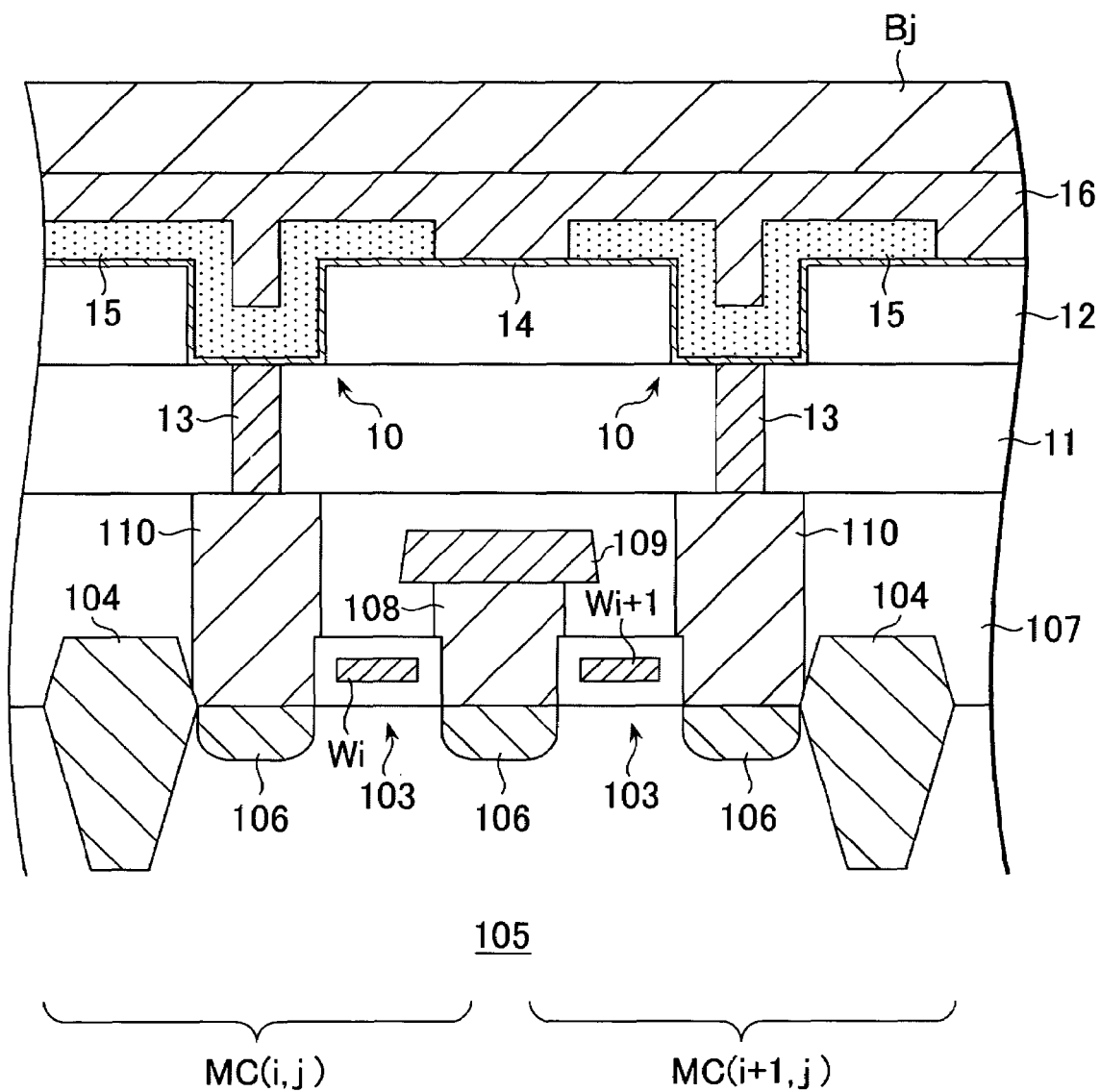
FIG. 4 is a cross-sectional view of an example of a memory cell using the memory element shown in FIG. 1.

FIG. 4 is a cross-sectional view of an example of a memory cell using the memory element 10. In FIG. 4, two memory cells MC (i, j) and MC (i+1, j) that are connected to the same bit line Bj are shown.

In the example shown in FIG. 4, the top electrode 16 of each memory element 10 is connected to bit line Bj and the bottom electrode 13 is connected to transistor 103. Word lines Wi and Wi +1 are connected to the gate electrode of the transistor 103. The active region 105, which is defined by element isolation regions 104, comprises three diffusion regions 106, whereby two transistors 103 are formed in a single active region 105. The two transistors 103 share a common source that is connected to the ground line 109 via a contact plug 108 in the interlayer insulation layer 107. The drain of each transistor 103 is connected to the bottom electrode 13 of the corresponding memory element 10 via a contact plug 110.

The top electrode 16 of each of the two memory elements 10 is connected to a common bit line Bj. As such, there is no need to form a separate electrode 16 for each of the two memory elements 10. Instead, as shown in FIG. 4, it is formed as a continuous electrode.

In the non-volatile semiconductor memory device thus constituted, data reads and writes can be carried out by using the row decoder 101 to activate one of the word lines W1 to Wn, and then passing a current through at least one of the bit lines B1 to Bm. That is, the transistors 103 are switched on in the memory cells of the activated word line, connecting the corresponding bit lines to ground via the memory element 10. In this state, phase changes can be effected in the recording layer 15 by passing write current through the bit lines selected by the column decoder 102.

Specifically, when a prescribed amount of current is used to raise the temperature of the phase change material of the recording layer 15 to at least the melting temperature Tm, shown in FIG. 2, and the current is then abruptly switched off, the rapid cooling that ensures switches the material into the amorphous phase. When an amount of current that is less than the prescribed amount is used to heat the phase change material of the recording layer 15 to a temperature that is at least as high as the crystallization temperature Tx shown in FIG. 2 but lower than the melting temperature Tm, and the current is then gradually reduced, the gradual cooling thus produced promotes crystal growth, switching the material to the crystalline phase.

Data can be read by using the row decoder 101 to activate one of the word lines W1 to Wn and then passing a read current through at least one of the bit lines B1 to Bm. A memory cell MC in which the recording layer 15 is in the amorphous phase has a high resistance and a memory cell MC in which the recording layer 15 is in the crystalline phase has a low resistance, so the phase state of the recording layer 15 can be known by using a sense amplifier (not shown) to detect this.

Phase states of the recording layer 15 can be associated with stored logical values. If an amorphous phase state is defined as "0" and a crystalline phase state as "1", for example, one binary bit of information can be stored in a single memory cell. Also, when moving from the amorphous phase to the crystalline phase, the crystallization ratio can be controlled in multiple levels or linearly by adjusting the time the recording layer 15 is held at a temperature that is not lower than the crystallization temperature Tx and lower than the melting temperature Tm. With multilevel control of the ratio between the amorphous phase and the crystalline phase, two or more bits of data can be stored in a single memory cell, while with linear control, information can be stored as analog data.

The method of manufacturing the non-volatile memory element 10 will now be described.

With reference to FIG. 1, to begin with, the first interlayer insulation layer 11 is formed, and the first through-hole 11a is formed in the first interlayer insulation layer 11. The insulation layer 11 may be formed by chemical vapor deposition (CVD), and the through-hole 11a may be formed by photolithography and dry etching.

Next, the bottom electrode 13 is formed on the first interlayer insulation layer 11, completely filling the first through-hole 11a, and the bottom electrode 13 is then polished until the upper surface 11b of the first interlayer insulation layer 11 is exposed; preferably, this is done using chemical mechanical polishing (CMP). In this way, the bottom electrode 13 is buried in the first through-hole 11a. It is preferable to use a method that provides good step coverage, such as CVD, to form the bottom electrode 13, ensuring that the first through-hole 11a is completely filled.

Next, the second interlayer insulation layer 12 is formed on the first interlayer insulation layer 11, and the second through-hole 12a is formed in the second interlayer insulation layer 12. The second interlayer insulation layer 12 may be formed by CVD, and the second through-hole 12a by photolithography. The second through-hole 12a has to have a diameter D2 that is larger than the diameter D1 of the first through-hole 11a, and has to be positioned so that at least a portion of the bottom electrode 13 is exposed.

Next, the thin-film insulation layer 14 is formed so that it covers the entire surface of the second interlayer insulation layer 12, including the inside wall of the second through-hole 12a (and the top of the bottom electrode 13). The thin-film insulation layer 14 can be formed by sputtering, thermal CVD, plasma CVD, atomic layer deposition (ALD) or other such methods.

Next, the recording layer 15 consisting of chalcogenide material is formed on the thin-film insulation layer 14. The recording layer 15 may be formed by sputtering or CVD, although there is no particular limitation on the method to be used. The recording layer 15 must not be thicker than a thickness that ensures sufficient coverage with respect to the diameter D2 of the second through-hole 12a. Patterning is used to isolate the recording layer 15 of each memory element 10 (see FIG. 4).

Lastly, the top electrode 16 is formed on the recording layer 15 and prescribed patterning is carried out, completing the fabrication of the non-volatile memory element 10 of this embodiment. Before it can be used as an actual memory, pore 14a is formed in the thin-film insulation layer 14 by applying a high voltage between the bottom electrode 13 and the top electrode 16 to produce a dielectric breakdown in the thin-film insulation layer 14. With the bottom electrode 13 and the recording layer 15 being connected by the pore 14a, the vicinity of the pore 14a becomes a heating region.

Thus, in accordance with the memory element 10 of this embodiment a pore 14a formed in the thin-film insulation layer 14 by dielectric breakdown is used as the current path, making it possible to form a very fine current path that does not depend on lithographic precision.

Moreover, the diameter D1 of the first through-hole 11a is smaller than the diameter D2 of the second through-hole 12a, reducing the thermal capacity of the bottom electrode 13. Since this reduces the amount of heat that diffuses from the heated region to the bottom electrode 13, it is possible to obtain a heating efficiency that is higher than that in the prior art. In addition, the memory element 10 can be fabricated using relatively simple methods.

A non-volatile memory element according to a second embodiment of the present invention will now be described.

Figure 5:
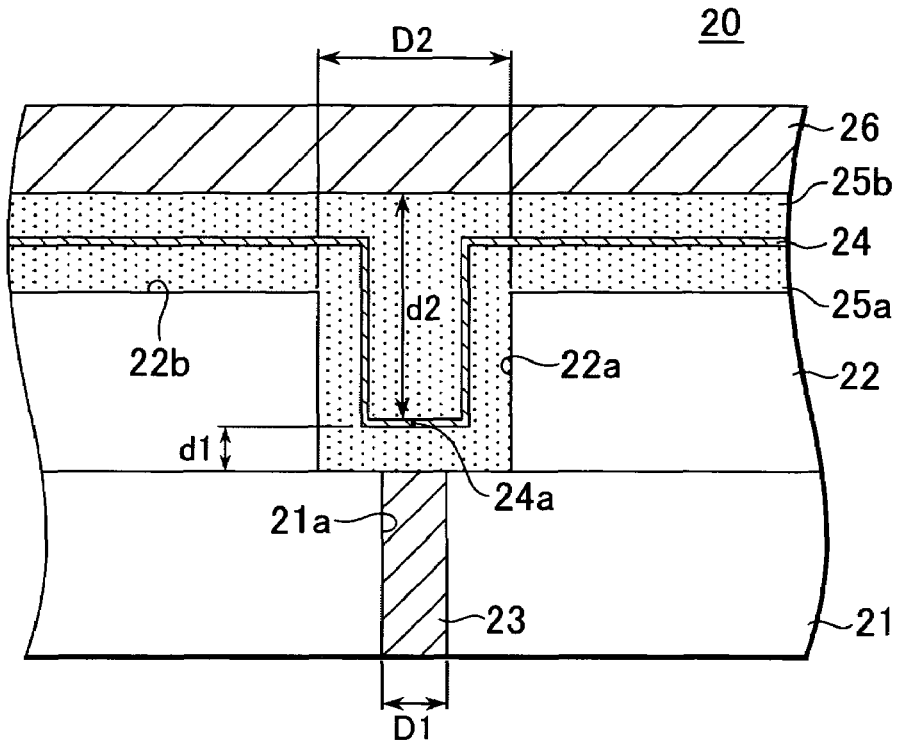
FIG. 5 is a cross-sectional view of the memory element according to a second embodiment of the present invention.

FIG. 5 is a cross-sectional view of the memory element 20 according to a second embodiment of the present invention.

With reference to FIG. 5, the non-volatile memory element 20 of this embodiment includes a first interlayer insulation layer 21 with a first through-hole 21a, a second interlayer insulation layer 22 with a second through-hole 22a, a bottom electrode 23 set within the first through-hole 21a, a first recording layer 25a, a thin-film insulation layer 24 and a second recording layer 25b formed, in that order, on the second interlayer insulation layer 22, and a top electrode 26 on the second recording layer 25b.

Thus, in this embodiment there are two recording layers, first recording layer 25a and second recording layer 25b, between which there is the thin-film insulation layer 24. Also, the first recording layer 25a is provided on the upper surface 22b of the second interlayer insulation layer 22 as well as in the second through-hole 22a, forming a three-layer stacked structure comprised of the first recording layer 25a, thin-film insulation layer 24 and second recording layer 25b. The recording layers 25a and 25b can be formed of the above-described chalcogenide material.

In this example, the diameter D1 of the first through-hole 21a is smaller than the diameter D2 of the second through-hole 22a. The diameter of the bottom electrode 23 is the same as that of the first through-hole 21a, reducing the thermal capacity of the bottom electrode 23.

Before the memory element 20 is actually used, a high voltage is applied across the electrodes 23 and 26 to produce dielectric breakdown and form a pore 24a in the thin-film insulation layer 24. The pore 24a forms in the bottom part of the second through-hole 22a where the electric field strength is highest, that is, in the region closest to the bottom electrode 23. The recording layers 25a and 25b are connected by the pore 24a, and the vicinity of the pore becomes a heating region.

Because the pore 24a is formed in the region closest to the bottom electrode 23, the distance d2 from the pore 24a to the top electrode 26 is greater than the distance d1 from the pore to the bottom electrode 23. This ensures that the top electrode 26, which has a large thermal capacity, is a sufficient distance away from the heating region.

The first recording layer 25a impedes the conduction of heat from the heating region to the bottom electrode 23. The thermal conductivity of the chalcogenide material of the first recording layer 25a is low, around one-third that of a silicon oxide, so providing the recording layer 25a between the bottom electrode 23 and the thin-film insulation layer 24 serves to further enhance the heating efficiency.

Concerning the fabrication of the memory element 20, after the second through-hole 22a is formed in the second interlayer insulation layer 22, the first recording layer 25a, thin-film insulation layer 24 and second recording layer 25b are formed over the entire surface of the second interlayer insulation layer 22, including the inside wall of the second through-hole 22a, forming a three-layer stack. After patterning is used to isolate the three-layer structure of each memory element 20, the top electrode 26 is formed on the second recording layer 25b and patterned to the required shape.

The first recording layer 25a, thin-film insulation layer 24 and second recording layer 25b are formed in a continuous process, enabling the bottom electrode 23 and thin-film insulation layer 24 to be spaced apart by the amount of the thickness of the first recording layer 25a.

The separation between the bottom electrode 23 and the thin-film insulation layer 24 can be maximized by using the largest possible setting for the thickness of the first recording layer 25a. However, the first recording layer 25a cannot be thicker than a thickness that ensures adequate coverage, with respect to the diameter D2 of the second through-hole 22a.

Thus, in the non-volatile memory element 20 according to this embodiment, the low-thermal-conductivity first recording layer 25a is provided between the bottom electrode 23 and the thin-film insulation layer 24, providing higher heating efficiency in addition to the effect provided by the memory element 10 of the first embodiment. Moreover, the memory element 20 can be fabricated using relatively simple methods.

A non-volatile memory element according to a third embodiment of the present invention will now be described.

Figure 6:
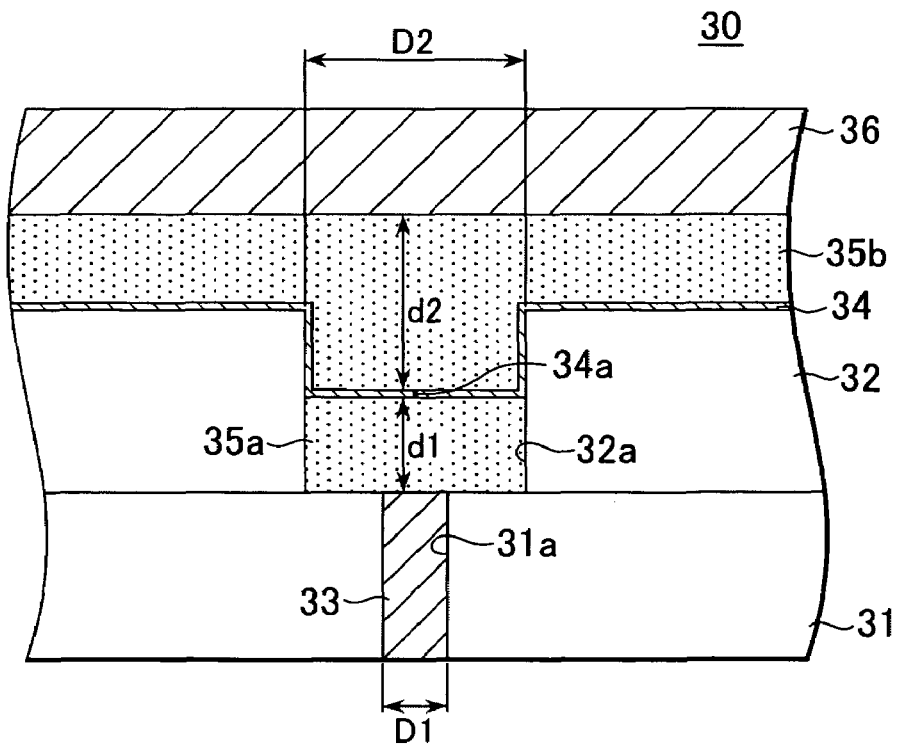
FIG. 6 is a cross-sectional view of the memory element according to a third embodiment of the present invention.

FIG. 6 is a cross-sectional view of the memory element 30 according to a third embodiment of the present invention.

With reference to FIG. 6, in the non-volatile memory element 30 of this embodiment, a first recording layer 35a is only provided at the bottom of the second through-hole 32a. In this embodiment, too, there are two recording layers, first recording layer 35a and second recording layer 35b, between which there is a thin-film insulation layer 34. Since the upper surface 32b of the second interlayer insulation layer 32 is not covered by the first recording layer 35a, the thin-film insulation layer 34 is formed directly on the upper surface 32b.

The diameter D1 of the first through-hole 31a filled by the bottom electrode 33 is smaller than the diameter D2 of the second through-hole 32a, filled by the recording layers 35a and 35b. The diameter of the bottom electrode 33 is the same as the diameter D1 of the first through-hole 31a, reducing the thermal capacity of the bottom electrode 33. The distance d2 from the pore 34a to the large-thermal-capacity top electrode 36 is greater than the distance d1 from the pore 34a to the small-thermal-capacity bottom electrode 33.

The method of manufacturing the non-volatile memory element 30 will now be described.

FIGS. 7 to 10 are cross-sectional views illustrating the steps of manufacturing the memory element 30.

Figure 7:
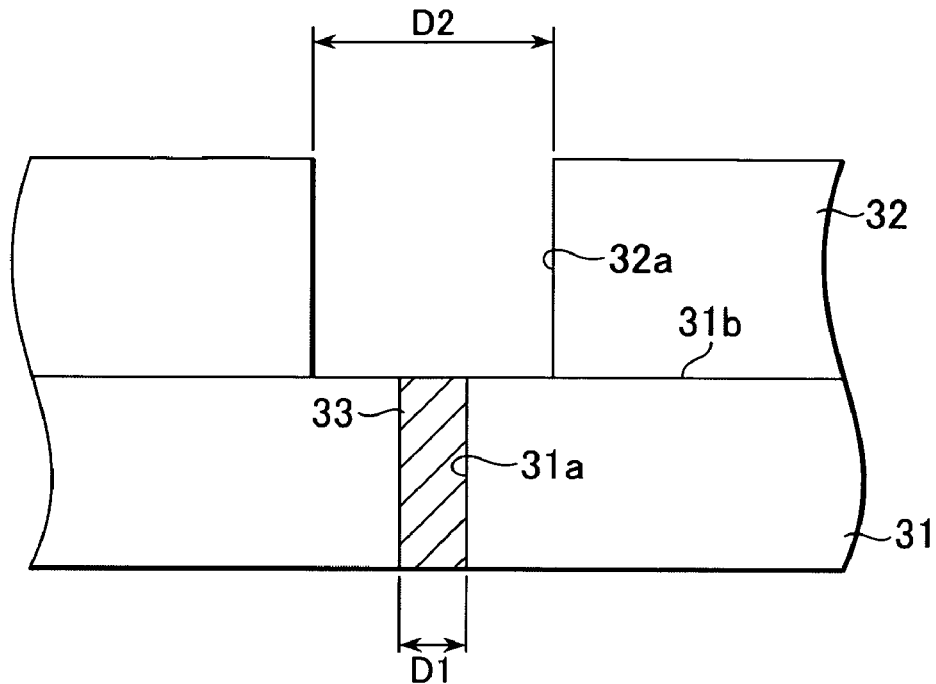
FIGS. 7 to 10 are cross-sectional views illustrating the steps of manufacturing the memory element shown in FIG. 6.

With reference to FIG. 7, first, the first interlayer insulation layer 31 is formed, and is followed by forming the first through-hole 31a in the first interlayer insulation layer 31. Then the bottom electrode 33 is formed on the first interlayer insulation layer 31, completely filling the first through-hole 31a, and CMP is used to polish the bottom electrode 33 until the upper surface 31b of the first interlayer insulation layer 31 is exposed. In this way, the bottom electrode 33 is buried in the first through-hole 11a. Next, the second interlayer insulation layer 32 is formed on the first interlayer insulation layer 31, and the second through-hole 32a is formed in the second interlayer insulation layer 32, exposing at least part of the bottom electrode 33.

Figure 8:
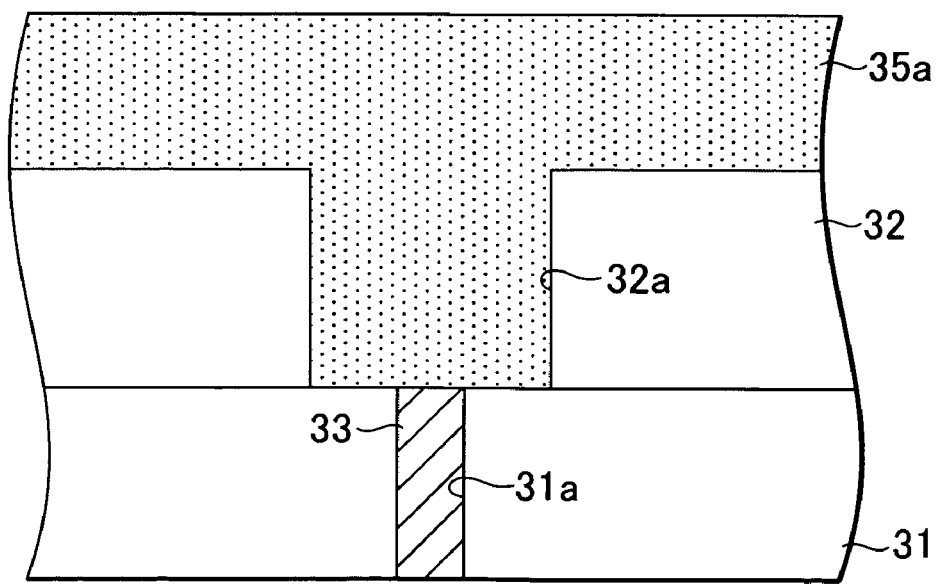
Figure 9:
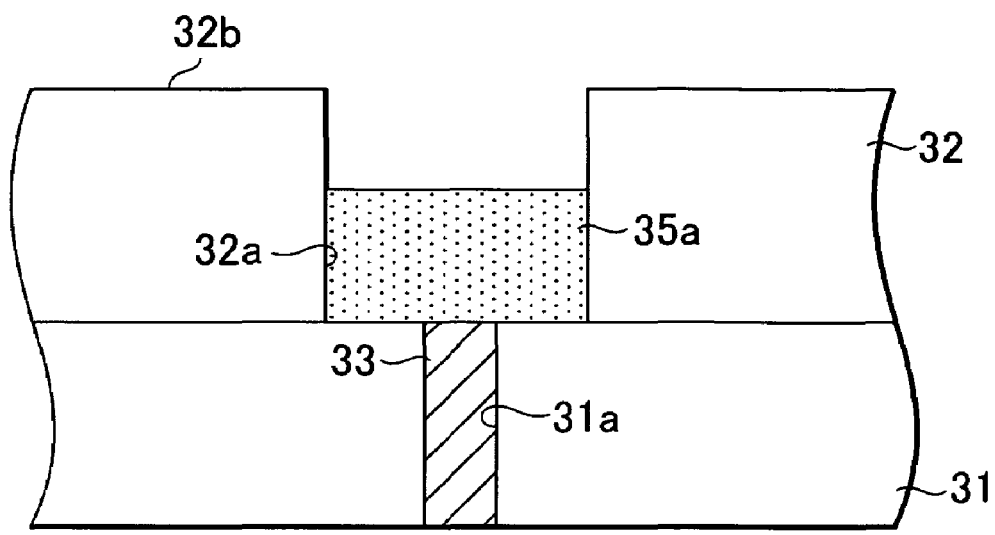

Next, as shown in FIG. 8, the first recording layer 35a is formed on the second interlayer insulation layer 32. The first recording layer 35a is made thick enough to completely fill the second through-hole 32a. Then, as shown in FIG. 9, the first recording layer 35a is etched back to expose the upper surface 32b of the second interlayer insulation layer 32, so that all that is left of the first recording layer 35a is the portion at the lower end of the second through-hole 32a.

Figure 10:
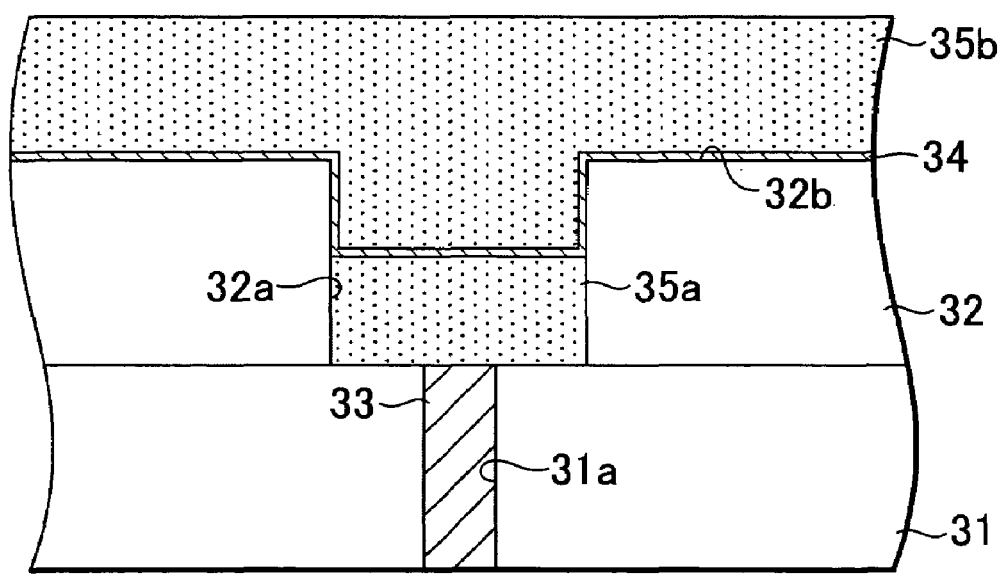

Next, as shown in FIG. 10, the thin-film insulation layer 34 is formed over the first recording layer 35a. Since the first recording layer 35a has already been etched back, exposing the upper surface 32b of the second interlayer insulation layer 32, the thin-film insulation layer 34 therefore is formed directly on the upper surface 32b. The thin-film insulation layer 34 can be formed by sputtering, thermal CVD, plasma CVD, ALD or other such methods. However, to prevent degeneration of the chalcogenide material of the first recording layer 35a, it is preferable to select a method in which the heat and atmosphere employed does not unduly affect the chalcogenide material.

Next, the second recording layer 35b is formed on the thin-film insulation layer 34, and patterning is used to isolate the second recording layer 35b of each memory element 30. Then, as shown in FIG. 6, the top electrode 36 is formed on the second recording layer 35b, and prescribed patterning is carried out, completing the fabrication of the non-volatile memory element 30 of this embodiment. Before it can be used as an actual memory, pore 34a is formed in the thin-film insulation layer 34 by applying a high voltage between the bottom electrode 33 and the top electrode 36 to produce a dielectric breakdown in the thin-film insulation layer 34. The pore 34a thus connecting the recording layers 35a and 35b becomes a heating region.

As described, in this embodiment the first recording layer 35a is formed as a thick layer that is then etched back, leaving just a portion at the lower end of the second through-hole 32a. This allows the first recording layer 35a to be formed with a greater thickness than that required to ensure adequate coverage with respect to the diameter D2 of the second through-hole 32a. As such, the distance d1 from the pore 34a to the bottom electrode 33 can be made greater than in the case of the memory element 20 of the second embodiment, providing higher heating efficiency in addition to the effect provided by the memory element 20 of the first embodiment.

Figure 11:
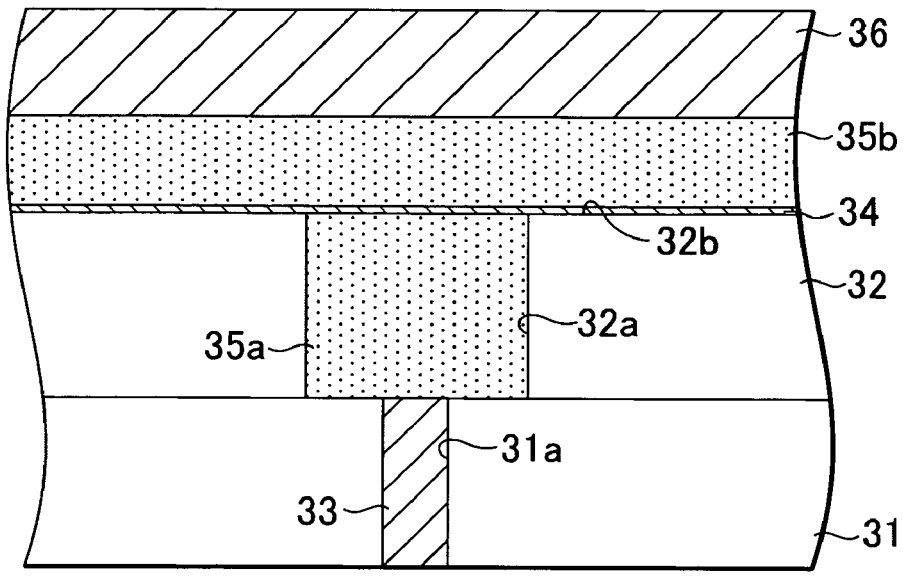
FIG. 11 is a cross-sectional view of a modified example of the memory element of the third embodiment.

Moreover, while in this embodiment just a portion of the first recording layer 35a is left at the lower end of the second through-hole 32a, in a modification illustrated in FIG. 11, the second through-hole 32a can instead be more or less completely filled by the first recording layer 35a. In this case, the first recording layer 35a is formed so that the upper surface thereof is substantially flush with the upper surface 32b of the second interlayer insulation layer 32. The first recording layer 35a can be adjusted to an arbitrary thickness by adjusting the growth and etching conditions as required. According to the structure shown in FIG. 11, a controllability of the process can be enhanced.

A non-volatile memory element according to a fourth embodiment of the present invention will now be described.

Figure 12:
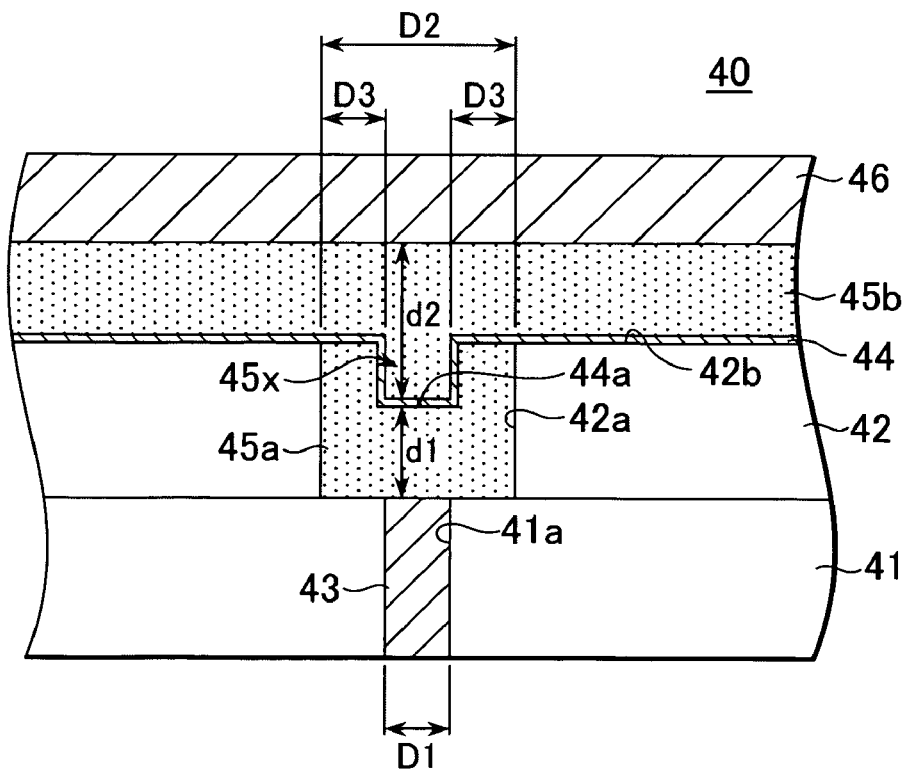
FIG. 12 is a cross-sectional view of the memory element according to a fourth embodiment of the present invention.

FIG. 12 is a cross-sectional view of the memory element 40 according to a fourth embodiment of the present invention.

As shown in FIG. 12, the non-volatile memory element 40 according to this embodiment has a cavity 45x in the upper surface of a first recording layer 45a. The cavity 45x is located in the center of said upper surface, so the distance D3 from the wall of the cavity to the inside wall of the second through-hole 42a is substantially uniform. Also, the upper surface of the first recording layer 45a is substantially flush with the upper surface 42b of the second interlayer insulation layer 42.

The diameter D1 of a first through-hole 41a containing the bottom electrode 43 is smaller than the diameter D2 of the second through-hole 42a filled with the recording layers 45a and 45b. The diameter of the bottom electrode 43 is the same as the diameter D1 of the first through-hole 41a, reducing the thermal capacity of the bottom electrode 43. Also, the distance d2 from the pore 44a to the large-thermal-capacity top electrode 46 is greater than the distance d1 from the pore 44a to the small-thermal-capacity bottom electrode 43.

The method of manufacturing the non-volatile memory element 40 will now be described.

Figure 13:
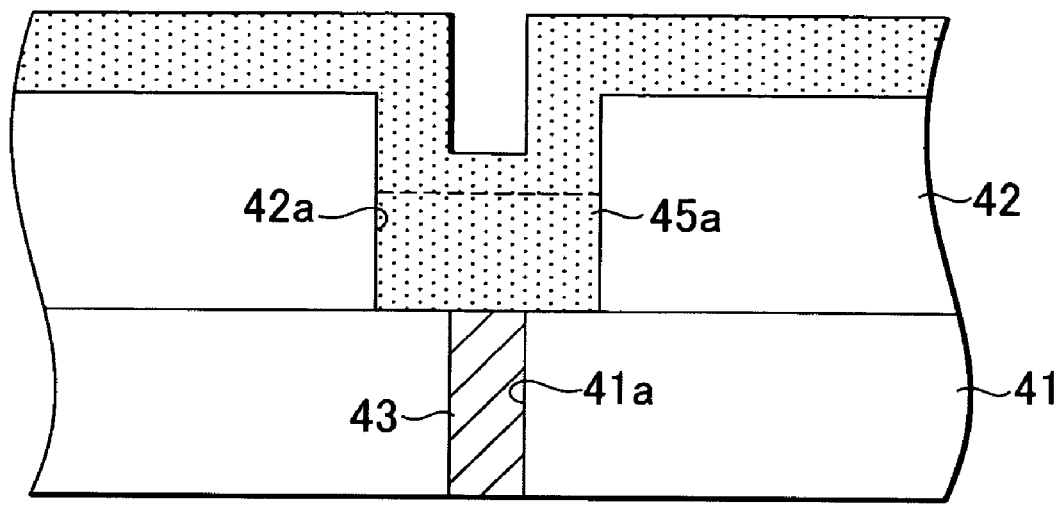
FIGS. 13 and 14 are cross-sectional views illustrating the steps of manufacturing the memory element shown in FIG. 12.
Figure 14:
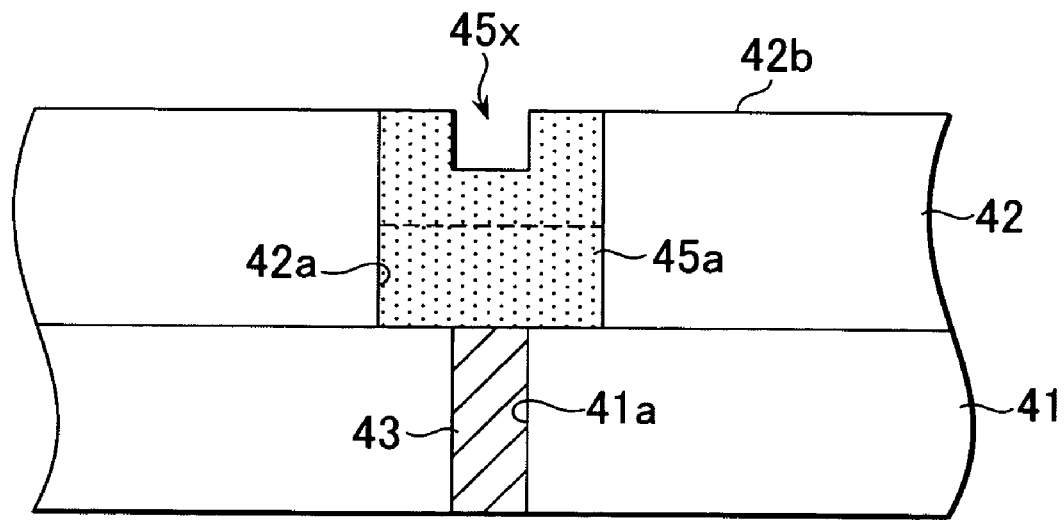

FIGS. 13 and 14 are cross-sectional views illustrating the steps of manufacturing the memory element 40.

After using the same steps as those shown in FIGS. 7 to 9, so that all that is left of the first recording layer 45a is the portion in the lower part of the second through-hole 42a, the first recording layer 45a is formed again, as shown in FIG. 13. The second time, the first recording layer 45a is formed to a thickness that does not completely fills the second through-hole 42a.

Next, the first recording layer 45a is etched back until the upper surface 42b of the second interlayer insulation layer 42 is exposed, as shown in FIG. 14. As a result, all that is left of the first recording layer 45a is the portion in the second through-hole 42a, with the cavity 45x in the center of the upper surface thereof.

Next, the thin-film insulation layer 44, second recording layer 45b and top electrode 46 are formed in that order, as shown in FIG. 12, and the required patterning is performed, completing the non-volatile memory element 40.

Because there is a cavity 45x formed in the top of the first recording layer 45a, when a high voltage is applied between the electrodes 43 and 46, the electric field is strongest at the bottom of the cavity 45x. Therefore, when the pore 44a is formed by dielectric breakdown, the probability is very high that it will form at the bottom part of the cavity 45x where the field strength is highest. Therefore, as well as providing the effect of the memory element 30 of the third embodiment, the memory element 40 reduces variation with respect to the point of pore formation.

A non-volatile memory element according to a fifth embodiment of the present invention will now be described.

Figure 15:
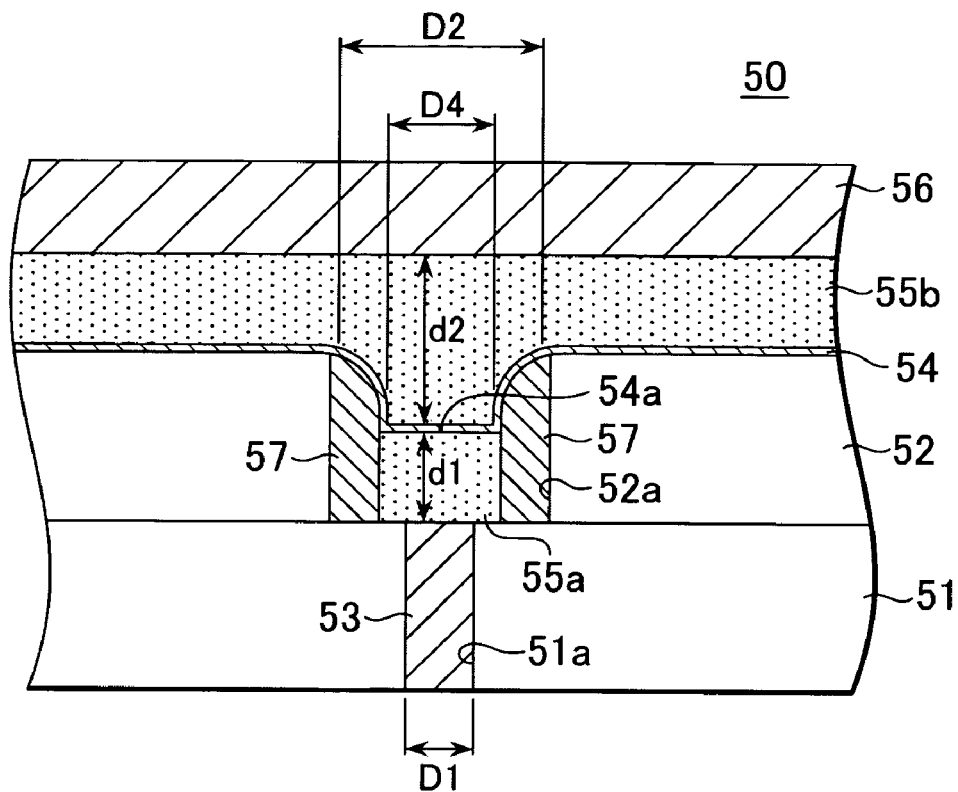
FIG. 15 is a cross-sectional view of the memory element according to a fifth embodiment of the present invention.

FIG. 15 is a cross-sectional view of the memory element 50 according to a fifth embodiment of the present invention.

In the memory element 50 of this embodiment, shown in FIG. 15, a sidewall 57 is formed on the inside wall of second through-hole 52a, which makes the diameter D4 of the first recording layer 55a in the second through-hole 52a smaller than the diameter D2 of the second through-hole 52a. Any insulation material may be used for the sidewall 57, such as $SiO_2$ or $Si_3N_4$ or the like. The first interlayer insulation layer 51 and second interlayer insulation layer 52 and so forth have the same constitution as the corresponding parts of the earlier embodiments described above.

The diameter D1 of the first through-hole 51a filled by the bottom electrode 53 is smaller than the diameter D2 of the second through-hole 52a, filled by the recording layers 55a and 55b. The diameter of the bottom electrode 53 is the same as the diameter D1 of the first through-hole 51a, reducing the thermal capacity of the bottom electrode 53. While there is no specific limitation on the relationship between the diameters D1 and D4, it is preferable for D4 to be larger than D1. The distance d2 from the pore 54a to the large-thermal-capacity top electrode 56 is greater than the distance d1 from the pore 54a to the small-thermal-capacity bottom electrode 53.

The method of manufacturing the non-volatile memory element 50 will now be described.

FIGS. 16 to 19 are cross-sectional views illustrating the steps of manufacturing the memory element 50.

Figure 16:
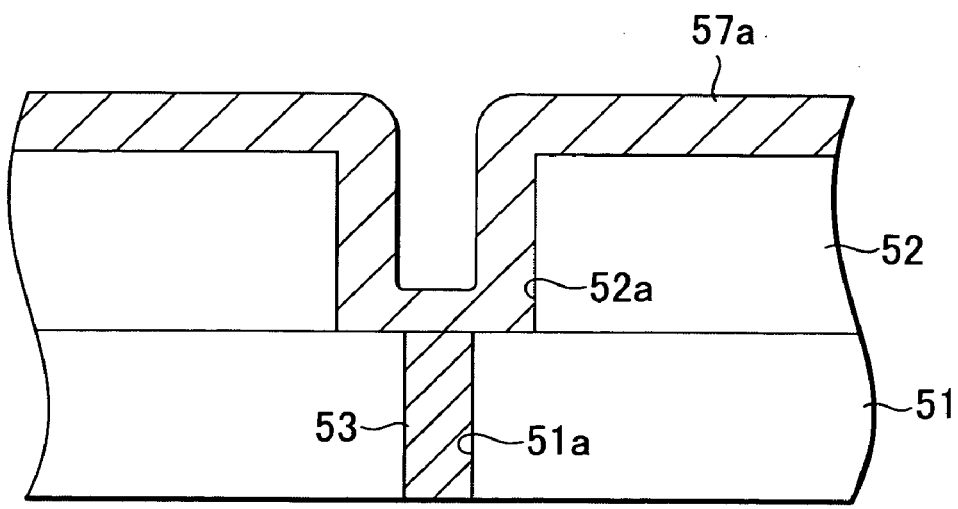
FIGS. 16 to 19 are cross-sectional views illustrating the steps of manufacturing the memory element shown in FIG. 15.
Figure 17:
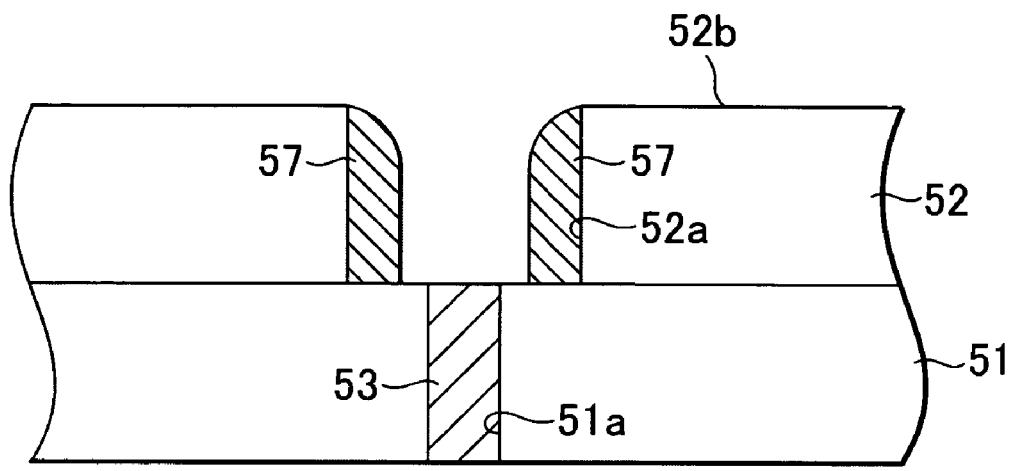

Using the same steps shown in FIG. 7, the second through-hole 52a is formed in the second interlayer insulation layer 52, exposing at least part of the bottom electrode 53. Then an insulation layer 57a constituting a sidewall is formed, as shown in FIG. 16. The insulation layer 57a has to be formed to a thickness that does not completely fills the second through-hole 52a. Next, as shown in FIG. 17, the insulation layer 57a is etched back to remove the portion on the upper surface 52b of the second interlayer insulation layer 52. As a result, all that is left of the insulation layer 57a is the portion constituting the sidewall 57 on the inside wall of the second through-hole 52a. The bottom portion has to be etched back to expose at least part of the bottom electrode 53.

Figure 18:
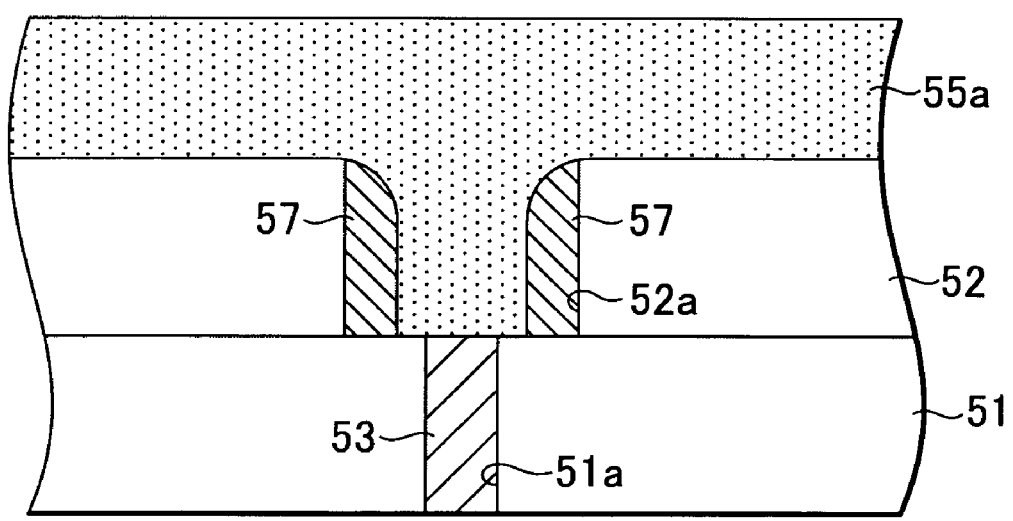

Next, as shown in FIG. 18, the first recording layer 55a is formed on the second interlayer insulation layer 52. The first recording layer 55a has to be formed thick enough to completely fill the second through-hole 52a.

Figure 19:
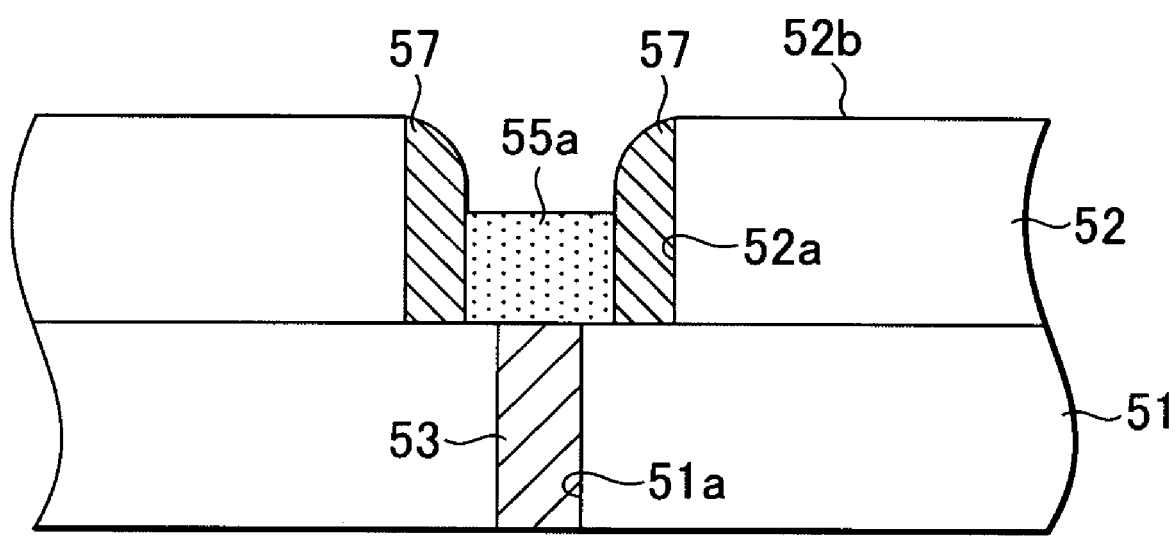

Next, as shown in FIG. 19, the first recording layer 55a is etched back until none remains on the upper surface 52b, so that all that is left of the first recording layer 55a is in the region surrounded by the sidewall 57. Following this, as shown in FIG. 15, the thin-film insulation layer 54, second recording layer 55b and top electrode 56 are formed, in that order, and the required patterning is performed, completing the non-volatile memory element 50.

In this embodiment, a sidewall 57 is provided in the second through-hole 52a, so the diameter of the through-hole with the first recording layer 55a, which is to say the diameter D4 of the first recording layer 55a, can be less than the lithography resolution, so the volume of the first recording layer 55a constituting a heater can be reduced, providing a further improvement in the heating efficiency. Thus, in addition to providing the same effect as the memory element 30 of the third embodiment, the memory element 50 provides higher heating efficiency.

A non-volatile memory element according to a sixth embodiment of the present invention will now be described.

Figure 20:
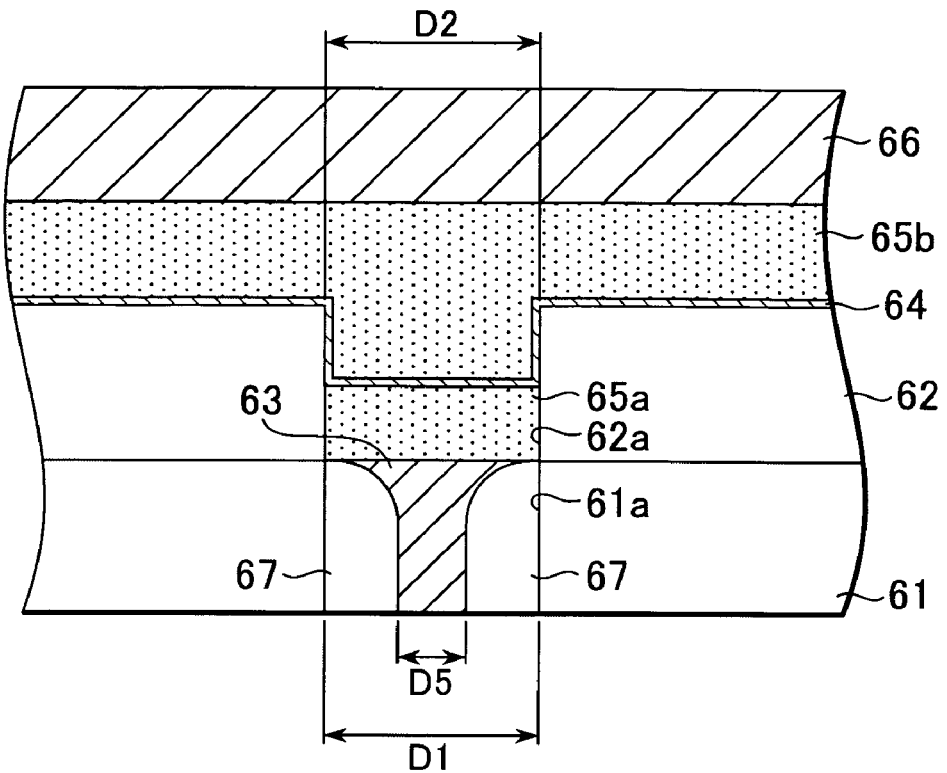
FIG. 20 is a cross-sectional view of the memory element according to a sixth embodiment of the present invention.

FIG. 20 is a cross-sectional view of the memory element according to a sixth embodiment 60.

In the memory element 60 of this embodiment, shown in FIG. 20, a sidewall 67 is formed on the inside wall of first through-hole 61a, which makes the diameter D5 of the bottom electrode 63 in the first through-hole 61a smaller than the diameter D2 of the second through-hole 62a. The diameter D1 of the first through-hole 61a and the diameter D2 of the second through-hole 62a are substantially the same. Any insulation material may be used for the sidewall 67, such as $SiO_2$ or $Si_3N_4$ or the like.

The first and second recording layers 65a and 65b, and of the thin-film insulation layer 64 and so forth, each have the same constitution as in the memory element 30 shown in FIG. 6, and the constitution of the first interlayer insulation layer 61 and second interlayer insulation layer 62 is the same as that of the corresponding parts of the earlier embodiments described above.

While the diameter D1 of the first through-hole 61a and the diameter D2 of the second through-hole 62a are approximately the same, the sidewall 67 provided on the inside wall of the first through-hole 61a makes the diameter D5 of the bottom electrode 63 smaller than the diameter D2 of the second through-hole 62a, thereby reducing the thermal capacity of the bottom electrode 63.

In this embodiment, due to the provision of the sidewall 57 in the first through-hole 61a, the diameter of the bottom electrode 63 can be less than the lithography resolution. Therefore, even though the diameters D1 and D2 are the same, the thermal capacity of the bottom electrode 63 can be decreased, reducing the amount of heat escaping from the heating region to the bottom electrode 63.

The present invention is in no way limited to the aforementioned embodiments, but rather various modifications are possible within the scope of the invention as recited in the claims, and naturally these modifications are included within the scope of the invention.

For example, although the memory element 50 of the fifth embodiment shown in FIG. 15 has two recording layers, the first recording layer 55a may be omitted. Moreover, the sidewall 57 may be added to the memory elements 10, 20, 30 and 40 of the first to fourth embodiments.

Moreover, while the sidewall 57 is formed on the inside wall of the second through-hole 52a in the memory element 50, and the sidewall 67 is formed on the inside wall of the first through-hole 61a in the memory element 60, a sidewall may be provided in both the first and second through-holes, provided the diameter of the bottom electrode is smaller than the diameter of the second through-hole.

Also, while in each of the above embodiments the second interlayer insulation layer has a single-layer structure, it may be configured as a stack of two or more insulation layers of different materials, making it easier to control the etching process used during the formation of the second through-hole.

Figure 21:
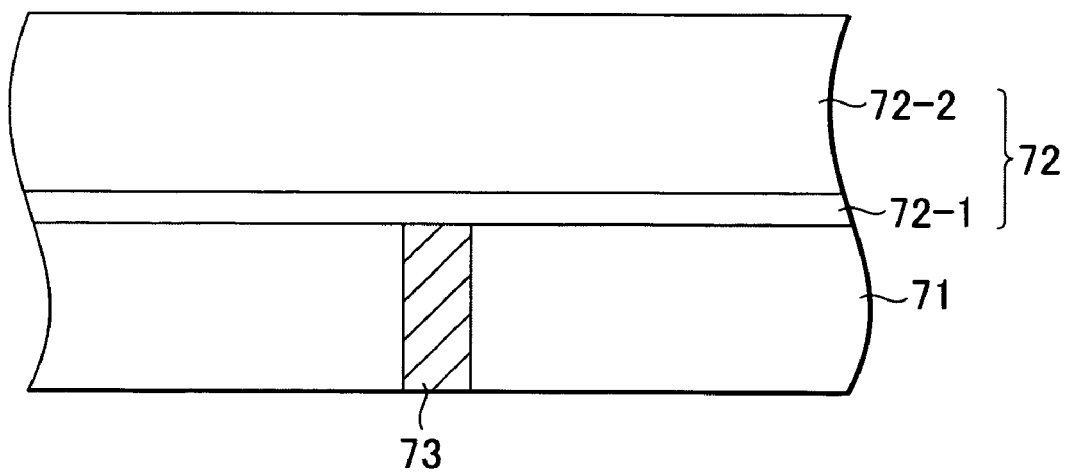
FIGS. 21 to 23 a cross-sectional views illustrating the steps of manufacturing a memory element in which the second interlayer insulation layer is constituted as a stack of layers.

More specifically, as shown in FIG. 21, after forming a first interlayer insulation layer 71 and a bottom electrode 73, a second interlayer insulation layer 72 is formed as a stack comprised of insulation layer 72-1 and insulation layer 72-2. For the insulation layer 72-1, it is necessary to choose a material having a different etching rate to that of the insulation layer 72-2, so that the insulation layer 72-1 can act as an etching stop when the insulation layer 72-2 is being etched. Similarly, for the first interlayer insulation layer 71, it is necessary to choose a material having a different etching rate to that of the insulation layer 72-1, so that the first interlayer insulation layer 71 can act as an etching stop when the insulation layer 72-1 is being etched. For example, if silicon oxide ($SiO_2$) is used for the first interlayer insulation layer 71 and the insulation layer 72-2, silicon nitride ($Si_3N_4$) can be used for the insulation layer 72-1.

Figure 22:
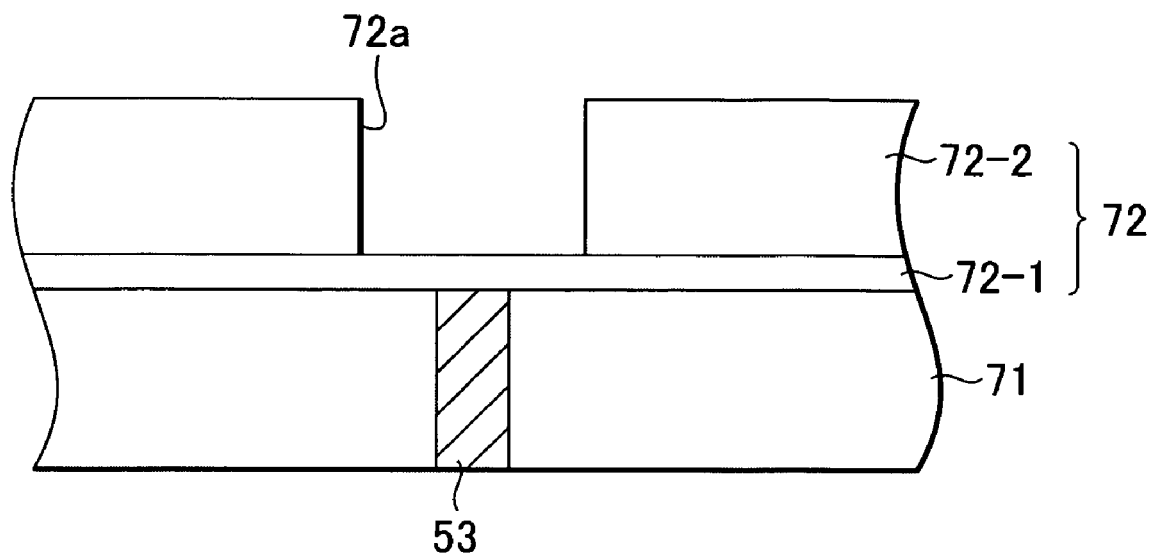
Figure 23:
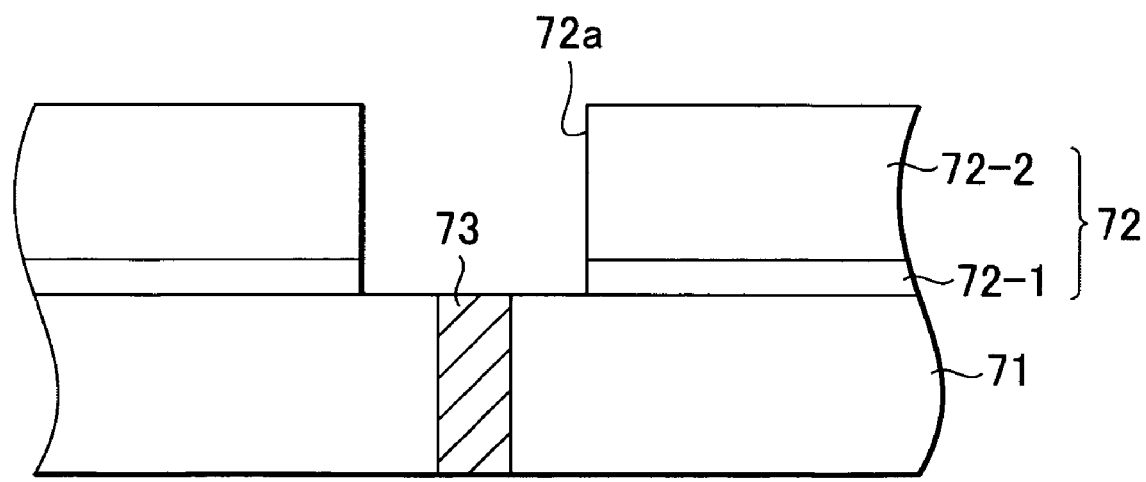

Next, as shown in FIG. 22, second through-hole 72a is formed in the insulation layer 72-2. Here, since the insulation layer 72-1 acts as an etching stop, the first interlayer insulation layer 71 is not etched at all. Next, as shown in FIG. 23, the insulation layer 72-1 is etched, exposing the bottom of the second through-hole 72a. Here, since the first interlayer insulation layer 71 acts as an etching stop, it does not suffer any major damage. Following this, the other layers and so forth are formed, using the same procedures explained with reference to the other embodiments, to thereby complete the non-volatile memory element.

Thus comprising the second interlayer insulation layer as a stack of two or more layers of different materials makes it easier to control the etching process when forming the second through-hole.

What is claimed is:

1. A non-volatile memory element, comprising:
a first interlayer insulation layer having a first through-hole;
a second interlayer insulation layer having a second through-hole formed on the first interlayer insulation layer with at least a part of the second through-hole overlapping at least a part of the first through-hole;
a bottom electrode provided in the first through-hole;
at least one phase change material layer, at least a part of the phase change material layer being provided in the second through-hole;
a top electrode provided on the second interlayer insulation layer; and
a thin-film insulation layer formed between the bottom electrode and the phase change material layer, the thin-film insulation layer having a pore through which the bottom electrode and the phase change material layer are electrically connected, the pore being smaller in diameter than the first through-hole and the second through-hole,
wherein the bottom electrode has a diameter that is smaller than the diameter of the second through-hole, the thin-film insulation layer is thinner than the phase change material layer, and the thin-film insulation layer is provided in contact with an upper surface of the second interlayer insulation layer and an inside wall of the second through-hole.

2. A non-volatile memory element, comprising:

a first interlayer insulation layer having a first through-hole;

a second interlayer insulation layer having a second through-hole formed on the first interlayer insulation layer with at least a part of the second through-hole overlapping at least a part of the first through-hole;

a bottom electrode provided in the first through-hole;

at least one phase change material layer, at least a part of the phase change material layer being provided in the second through-hole;

a top electrode provided on the second interlayer insulation layer;

a thin-film insulation layer formed between the bottom electrode and the phase change material layer, the thin-film insulation layer having a pore through which the bottom electrode and the phase change material layer are electrically connected, the pore being smaller in diameter than the first through-hole and the second through-hole; and a sidewall insulation layer covering an inside wall of the second through-hole, wherein the bottom electrode has a diameter that is smaller than the diameter of the second through-hole, the thin-film insulation layer is thinner than the phase change material layer.

3. A non-volatile memory element, comprising:

a first interlayer insulation layer having a first through-hole;

a second interlayer insulation layer having a second through-hole formed on the first interlayer insulation layer with at least a part of the second through-hole overlapping at least a part of the first through-hole;

a bottom electrode provided in the first through-hole;

at least one phase change material layer, at least a part of the phase change material layer being provided in the second through-hole;

a top electrode provided on the second interlayer insulation layer; and a thin-film insulation layer formed between the bottom electrode and the phase change material layer, the thin-film insulation layer having a pore through which the bottom electrode and the phase change material layer are electrically connected, the pore being smaller in diameter than the first through-hole and the second through-hole, wherein the bottom electrode has a diameter that is smaller than the diameter of the second through-hole, the thin-film insulation layer is thinner than the phase change material layer, and the second interlayer insulation layer includes at least two insulation layers composed of different materials.

* * * * *